United States Patent
Gagliardo et al.

(10) Patent No.: US 10,634,727 B2
(45) Date of Patent: Apr. 28, 2020

(54) FUEL CELL STACK CELL VOLTAGE SENSOR DIAGNOSTIC

(71) Applicant: GM Global Technology Operations LLC, Detroit, MI (US)

(72) Inventors: Jeffrey J. Gagliardo, Clarkston, MI (US); Andrew J. Maslyn, Novi, MI (US); Joseph Berg, West Bloomfield, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 202 days.

(21) Appl. No.: 15/825,672

(22) Filed: Nov. 29, 2017

(65) Prior Publication Data
US 2019/0162790 A1 May 30, 2019

(51) Int. Cl.
| | | |
|---|---|---|
| *G01R 31/36* | (2020.01) | |
| *B60W 10/04* | (2006.01) | |
| *H01M 8/04537* | (2016.01) | |
| *G01R 31/3835* | (2019.01) | |
| *H01M 8/04858* | (2016.01) | |
| *H01M 8/04664* | (2016.01) | |
| *H01M 8/04746* | (2016.01) | |
| *H01M 8/04701* | (2016.01) | |

(Continued)

(52) U.S. Cl.
CPC ......... *G01R 31/3835* (2019.01); *B60W 10/04* (2013.01); *H01M 8/0444* (2013.01); *H01M 8/0488* (2013.01); *H01M 8/0494* (2013.01); *H01M 8/04179* (2013.01); *H01M 8/04552* (2013.01); *H01M 8/04559* (2013.01); *H01M 8/04686* (2013.01); *H01M 8/04701* (2013.01); *H01M 8/04746* (2013.01); *H01M 2250/20* (2013.01)

(58) Field of Classification Search
CPC .. B60W 10/28; B60W 10/251; B60W 10/285; B60W 2710/28; B60W 2710/285; H01M 2250/20; H01M 8/04313; H01M 8/04537; H01M 8/04544; H01M 8/04552; H01M 8/04559; H01M 8/04664; H01M 8/04671; H01M 8/04679
See application file for complete search history.

(56) References Cited

U.S. PATENT DOCUMENTS

| | | | |
|---|---|---|---|
| 2006/0012340 A1* | 1/2006 | Saeki .................. | H01M 8/0488 320/132 |
| 2008/0032163 A1* | 2/2008 | Usborne ........... | H01M 8/04223 429/429 |

(Continued)

*Primary Examiner* — Peter D Nolan
*Assistant Examiner* — Sara J Lewandroski

(57) ABSTRACT

A method for evaluating voltage sensor output using a diagnostic system includes: measuring an overall fuel cell stack voltage using a stack voltage sensor; identifying a fuel cell voltage of a first end cell using a first end cell voltage sensor and a second end cell using a second end cell voltage sensor; determining if a maximum value of the overall fuel cell stack voltage, the fuel cell voltage of the first end cell or the second end cell is less than a sensor limit, and if a minimum value of the fuel cell voltages is greater than the sensor limit; performing a test to identify if the maximum value is greater than an average sensor signal value and if the average sensor signal value is greater than the minimum value; and conducting a test to identify if the minimum value is less than a first predetermined threshold.

17 Claims, 3 Drawing Sheets

(51) Int. Cl.
  *H01M 8/0444* (2016.01)
  *H01M 8/04828* (2016.01)
  *H01M 8/04119* (2016.01)

(56) References Cited

U.S. PATENT DOCUMENTS

| | | | | |
|---|---|---|---|---|
| 2008/0191702 A1* | 8/2008 | Coenen | G01R 31/389 | 324/434 |
| 2008/0311437 A1* | 12/2008 | Sienkowski | H01M 8/04223 | 429/410 |
| 2008/0311442 A1* | 12/2008 | Sienkowski | H01M 8/04462 | 429/430 |
| 2010/0055521 A1* | 3/2010 | Umayahara | H01M 8/04619 | 429/429 |
| 2010/0261079 A1* | 10/2010 | Kells | H01M 8/04037 | 429/429 |
| 2011/0014535 A1* | 1/2011 | Choi | H01M 8/04358 | 429/432 |
| 2011/0086286 A1* | 4/2011 | Ganapathy | H01M 8/04067 | 429/432 |
| 2011/0178743 A1* | 7/2011 | Krause | H01M 8/04552 | 702/63 |
| 2012/0019254 A1* | 1/2012 | Zhang | H01M 8/04552 | 324/434 |
| 2012/0028152 A1* | 2/2012 | Harris | H01M 8/04447 | 429/432 |
| 2012/0100445 A1* | 4/2012 | Naganuma | H01M 8/04552 | 429/414 |
| 2013/0164645 A1* | 6/2013 | Takaichi | H01M 8/04552 | 429/432 |
| 2014/0072893 A1* | 3/2014 | Moses | H01M 8/04873 | 429/429 |
| 2014/0162159 A1* | 6/2014 | Lebzelter | H01M 8/04679 | 429/432 |
| 2014/0272652 A1* | 9/2014 | Lebzelter | H01M 8/04992 | 429/431 |
| 2014/0272654 A1* | 9/2014 | Lebzelter | H01M 8/04089 | 429/432 |
| 2014/0333316 A1* | 11/2014 | Toida | H01M 8/04559 | 324/426 |
| 2016/0149237 A1* | 5/2016 | Yu | H01M 8/04268 | 429/429 |
| 2017/0005350 A1* | 1/2017 | Niroumand | H01M 8/04992 | |
| 2017/0324106 A1* | 11/2017 | Sinha | H01M 8/04291 | |
| 2018/0034076 A1* | 2/2018 | Hasegawa | H01M 8/04067 | |
| 2018/0138530 A1* | 5/2018 | Tabatowski-Bush | H01M 8/04671 | |
| 2018/0203074 A1* | 7/2018 | Devaal | G01N 27/026 | |

* cited by examiner

FUEL CELL STACK CELL VOLTAGE SENSOR DIAGNOSTIC

INTRODUCTION

The present disclosure relates to a system and method for monitoring hydrogen fuel cell stack voltage.

Known hydrogen fuel cells and fuel cell stacks used in automobile vehicle applications employ at least one voltage sensor for every other fuel cell in the stack, or provide a dedicated voltage sensor for measuring the voltage potential of each fuel cell in a fuel cell stack. The quantity of voltage sensors is therefore cost intensive. It is presently considered that reducing the quantity of voltage sensors reduces the quantity and therefore the quality of sampling points used to identify if sensor drift is occurring or if a sensor failure has occurred.

At present, an incorrect sensor reading may be interpreted as an electrochemical phenomena and the sensor reading may not be immediately recognized as faulty. There is also no known method to identify a faulty sensor whose output is inside a range of readings that could be feasible due to electrochemical processes within the fuel cell stack. A faulty cell in a fuel cell stack may therefore go unrecognized as the reading from the faulty cell sensor may indicate a normal condition when in fact a cell problem may be occurring.

Thus, while current fuel cell stack voltage sensor systems achieve their intended purpose, there is a need for a new and improved system and method for measuring the conditions of a fuel cell stack using a fuel cell stack voltage sensor system.

SUMMARY

According to several aspects, a method for evaluating voltage sensor output using a fuel cell stack voltage sensor diagnostic system includes: determining in a first level rationality test if a maximum value of a fuel cell voltage sensor signal of a fuel cell stack is less than a sensor limit, and if a minimum value of the sensor signal is greater than the sensor limit; performing a second level rationality test to identify if the maximum value of the sensor signal is greater than an average sensor signal value and if the average sensor signal value is greater than the minimum value of the sensor signal; and conducting a third level rationality test to identify if the minimum value of the sensor signal is less than a first predetermined threshold.

In another aspect of the present disclosure, the method includes observing the power of the system to identify if the fuel cell stack is operating in a low power mode if the minimum value of the sensor signal is less than the first predetermined threshold.

In another aspect of the present disclosure, the method includes conducting a time request if a negative response is generated to the low power observation wherein a determination of a time since operation at low power is compared against a predetermined minimum time.

In another aspect of the present disclosure, the method includes sending a low power request to the vehicle system controller if a negative response is generated to the low power observation and a predetermined time limit has been reached indicating the fuel cell stack has been operating at high power for greater than the predetermined minimum time.

In another aspect of the present disclosure, the method includes sending a request to perform an enhanced reactant concentration test to the vehicle system controller; and performing the enhanced reactant concentration test when permitted by the vehicle system controller including increasing at least one of a system pressure, a system temperature, and a system flow to remove liquid water in the fuel cell stack.

In another aspect of the present disclosure, the method includes in a first comparison test conducting a reanalysis of the fuel cell voltage sensor signal to identify if the minimum value of the sensor signal is less than a second predetermined threshold at least equal to or higher than the first predetermined threshold.

In another aspect of the present disclosure, the method includes submitting an open circuit voltage request to the vehicle system controller.

In another aspect of the present disclosure, the method includes: after the open circuit voltage request is granted, conducting a reanalysis of the fuel cell voltage sensor signal and in a second comparison test the minimum value of the sensor signal is compared against a third predetermined threshold at least equal to or higher than the second predetermined threshold; and evaluating if any other diagnostic faults are active.

In another aspect of the present disclosure, the method includes generating a cell measurement failure warning if either the maximum value of the sensor signal is greater than the sensor limit or if the minimum value of the sensor signal is less than the sensor limit.

In another aspect of the present disclosure, the method includes generating the cell measurement failure warning if either the maximum value of the sensor signal is greater than the average sensor signal value or if the average sensor signal value is less than the minimum value of the sensor signal.

According to several aspects, a method for evaluating voltage sensor output using a fuel cell stack voltage sensor diagnostic system includes: measuring an overall fuel cell stack voltage using a fuel cell stack voltage sensor; determining in a first level rationality test if a maximum value of the overall fuel cell stack voltage is less than a sensor limit, and if a minimum value of the overall fuel cell stack voltage is greater than the sensor limit; performing a second level rationality test to identify if the maximum value is greater than an average sensor signal value and if the average sensor signal value is greater than the minimum value; and conducting a third level rationality test to identify if the minimum value is less than a first predetermined threshold.

In another aspect of the present disclosure, the method includes: initiating a power request to a vehicle system controller to identify if the fuel cell stack is operating in a low power mode if the minimum value is less than the first predetermined threshold; and sending a low power request to the vehicle system controller if a positive response is generated to the power request indicating the fuel cell stack has been operating at low power for greater than a predetermined minimum time.

In another aspect of the present disclosure, the method includes sending a request to perform an enhanced reactant concentration test to the vehicle system controller after confirming the fuel cell stack has been operating at low power for greater than the predetermined minimum time.

In another aspect of the present disclosure, the method includes: performing the enhanced reactant concentration test when permitted by the vehicle system controller including increasing at least one of a system pressure, a system temperature and a system flow to remove liquid water in the fuel cell stack; and repeating the measuring and the identifying steps.

In another aspect of the present disclosure, the method includes in a first comparison test conducting a reanalysis of the overall fuel cell stack voltage, the fuel cell voltage of the first end cell or the fuel cell voltage of the second end cell.

In another aspect of the present disclosure, the method includes: submitting an open circuit voltage request to the vehicle system controller if the minimum value is less than a second predetermined threshold at least equal to or higher than the first predetermined threshold; and after the open circuit voltage request is granted, conducting a reanalysis of the of the overall fuel cell stack voltage, the fuel cell voltage of the first end cell or the fuel cell voltage of the second end cell and in a second comparison test the minimum value is compared against a third predetermined threshold at least equal to or higher than the second predetermined threshold.

In another aspect of the present disclosure, the method includes conducting a fuel cell stack short analysis if the minimum value is less than the third predetermined threshold.

According to several aspects, a method for evaluating voltage sensor output using a fuel cell stack voltage sensor diagnostic system includes: measuring an overall fuel cell stack voltage using a fuel cell stack voltage sensor; identifying a fuel cell voltage of each of a first end cell of the fuel cell stack using a first end cell voltage sensor and a second end cell of the fuel cell stack using a second end cell voltage sensor; determining in a first level rationality test if a maximum value of the overall fuel cell stack voltage, the fuel cell voltage of the first end cell or the fuel cell voltage of the second end cell is less than a sensor limit, and if a minimum value of the of the overall fuel cell stack voltage, the fuel cell voltage of the first end cell or the fuel cell voltage of the second end cell is greater than the sensor limit; performing a second level rationality test to identify if the maximum value is greater than an average sensor signal value and if the average sensor signal value is greater than the minimum value; conducting a third level rationality test to identify if the minimum value is less than a first predetermined threshold; initiating a power request to a vehicle system controller to identify if the fuel cell stack is operating in a low power mode if the minimum value is less than the first predetermined threshold; and sending a request to perform an enhanced reactant concentration test to the vehicle system controller after confirming the fuel cell stack has been operating at low power for greater than the predetermined minimum time.

In another aspect of the present disclosure, the method includes determining fuel cell voltage values ranging between −1.5 potential volts DC to +1.5 potential volts DC for multiple characteristics of the fuel cell stack including voltage ranges indicating cathode-oxygen evolution, cathode carbon corrosion, cathode ECSA loss, normal operating range, cathode starvation, anode-platinum-oxide growth, anode carbon corrosion, and anode oxygen evolution.

In another aspect of the present disclosure, the method includes: conducting a reanalysis of the overall fuel cell stack voltage, the fuel cell voltage of the first end cell or the fuel cell voltage of the second end cell; submitting an open circuit voltage request to the vehicle system controller if the minimum value is less than a second predetermined threshold at least equal to or higher than the first predetermined threshold; requesting an open circuit voltage state; and conducting a reanalysis of the overall fuel cell stack voltage, the fuel cell voltage of the first end cell or the fuel cell voltage of the second end cell and in a second comparison test comparing the minimum value against a third predetermined threshold at least equal to or higher than the second predetermined threshold.

Further areas of applicability will become apparent from the description provided herein. It should be understood that the description and specific examples are intended for purposes of illustration only and are not intended to limit the scope of the present disclosure.

BRIEF DESCRIPTION OF THE DRAWINGS

The drawings described herein are for illustration purposes only and are not intended to limit the scope of the present disclosure in any way.

DETAILED DESCRIPTION

The following description is merely exemplary in nature and is not intended to limit the present disclosure, application, or uses.

Figure 1:
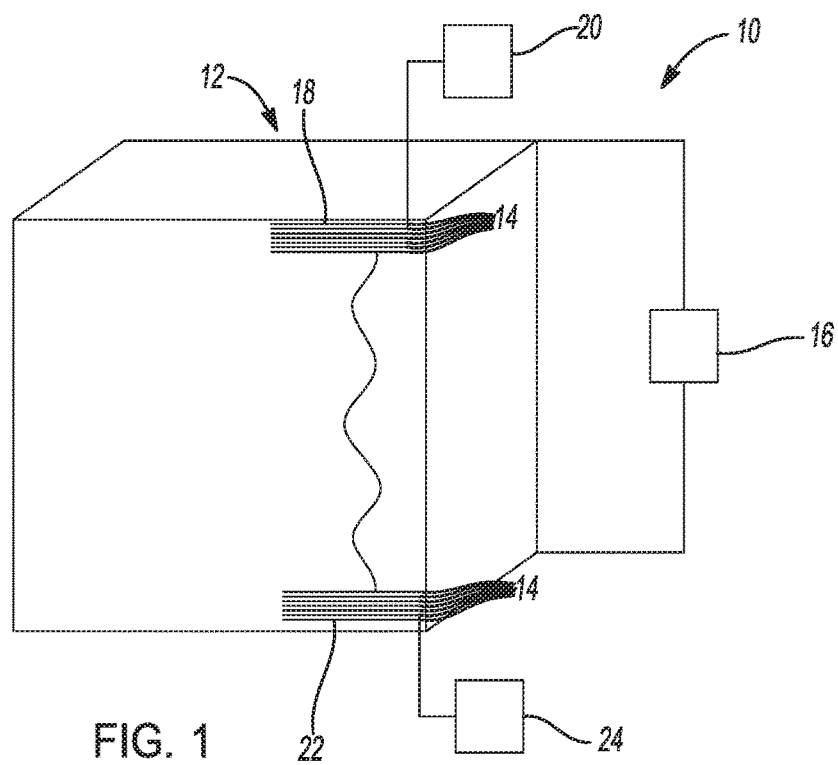
FIG. 1 is a front perspective view of a fuel cell stack according to an exemplary embodiment.

Referring to FIG. 1, a fuel cell stack voltage sensor diagnostic system 10 provides diagnostic information for an exemplary fuel cell stack 12 which may include multiple individual fuel cells 14. According to several aspects, the fuel cell stack voltage sensor diagnostic system 10 includes a minimum of one overall stack voltage sensor 16 which can be used to obtain an overall stack voltage. According to further aspects, in addition to the overall stack voltage sensor 16 the fuel cell stack voltage sensor diagnostic system 10 can further include a voltage sensor dedicated to obtaining a cell voltage of each of the opposed end cells of the fuel cell stack 12. The voltage of a first end cell 18 can be obtained using a dedicated first end cell sensor 20. Similarly, the voltage of a second end cell 22 can be obtained using a dedicated second end cell sensor 24. End cell data is useful because the end cells normally operate at the highest temperature extremes of the fuel cell stack and can also identify if operating conditions such as cell flooding, hydrogen starvation, or the like may be occurring.

Referring to FIG. 2 and again to FIG. 1, the fuel cell stack voltage sensor diagnostic system 10 incorporates data from a graph 26 into an algorithm 28 and using the algorithm 28 distinguishes a sensed voltage condition of the fuel cell stack 12 shown and described in reference to FIG. 1, or an individual fuel cell 14 of the fuel cell stack 12 represents either a physical phenomenon that aligns with the physics of the fuel cell stack 12 from a sensor error. Examples of a sensor error can include sensor drift and a sensed condition that may be within the anticipated conditions of the fuel cell but which may be an error or a fuel cell problem.

The graph 26 depicts typical fuel cell voltage values on an ordinate 29 ranging from −1.5 potential volts DC to +1.5 potential volts DC for multiple measured or measurable characteristics of the fuel cell stack 12 presented on an abscissa 30. These characteristics can include the ranges of a cathode-oxygen evolution reaction value 32, a cathode carbon corrosion value 34, a cathode-ECSA loss value 36, a normal operating value 38, a cathode starvation value 40, an anode-platinum-oxide value 42, an anode-carbon corrosion value 44, and an anode-oxygen evolution reaction value 46.

A sensor normal measurement range curve 48 is depicted covering values of a sensor measurement range 50 between approximately −1.0 VDC and +1.0 VDC. Characteristic values such as the cathode-oxygen evolution reaction value 32 normally range from approximately +1.4 to +1.5 VDC and when sensed are considered to be outside of the normal sensor measurement range 50 and are therefore considered an obvious sensor fault. Characteristic values such as the anode-carbon corrosion value 44 normally range between approximately −0.5 VDC to −1.5 VDC, which overlaps with the sensor measurement range 50, therefore an indicated anode-carbon corrosion value 44 signal cannot be easily identified as either a stack fault or a normal measurement range issue. Characteristic values such as the cathode starvation value 40 normally occur entirely within the normal sensor measurement range 50 of the voltage sensor, therefore if sensor drift or a similar sensor failure is occurring a sensor value identifying the cathode starvation value 40 will not normally identify if a fuel cell or a fuel cell stack problem is present. It is therefore evident that a different approach is required to distinguish between a stack fault and a normal measurement range issue. The algorithm 28 is provided to distinguish between a stack fault and a normal measurement range issue.

The algorithm 28 in a first step 52 receives the sensor signals and in a second step 54 begins a diagnostic analyses by initially conducting a three (3) level rationality test of the sensor signal(s). In a first level or level I rationality test 56 it is determined if a maximum value of the sensor signal is less than a sensor limit, and if a minimum value of the sensor signal is greater than the sensor limit. If either the maximum value of the sensor signal is greater than the sensor limit or if the minimum value of the sensor signal is less than the sensor limit the sensor is not deemed to be faulty, however a cell measurement failure warning 58 is generated, for which a predetermined remediate action can be taken.

If the maximum value of the sensor signal is less than the sensor limit or if the minimum value of the sensor signal is greater than the sensor limit a second level or level II rationality test 60 is conducted. In the level II rationality test 60 it is determined if a maximum value of the sensor signal is greater than an average sensor signal value and if an average sensor signal value is greater than the minimum value of the sensor signal. If either the maximum value of the sensor signal is greater than the average sensor signal value or if the average sensor signal value is less than the minimum value of the sensor signal the sensor is not deemed to be faulty, however the cell measurement failure warning 58 is generated, for which a predetermined remediate action can be taken.

A failure of either the level I rationality test 56 or the level II rationality test 60 which is not indicative of a sensor fault or failure may be caused for example by an individual cell short or a cell stack short. A cell short or a cell stack short can be identified using a separate test outside of the scope of the present disclosure.

Figure 3:
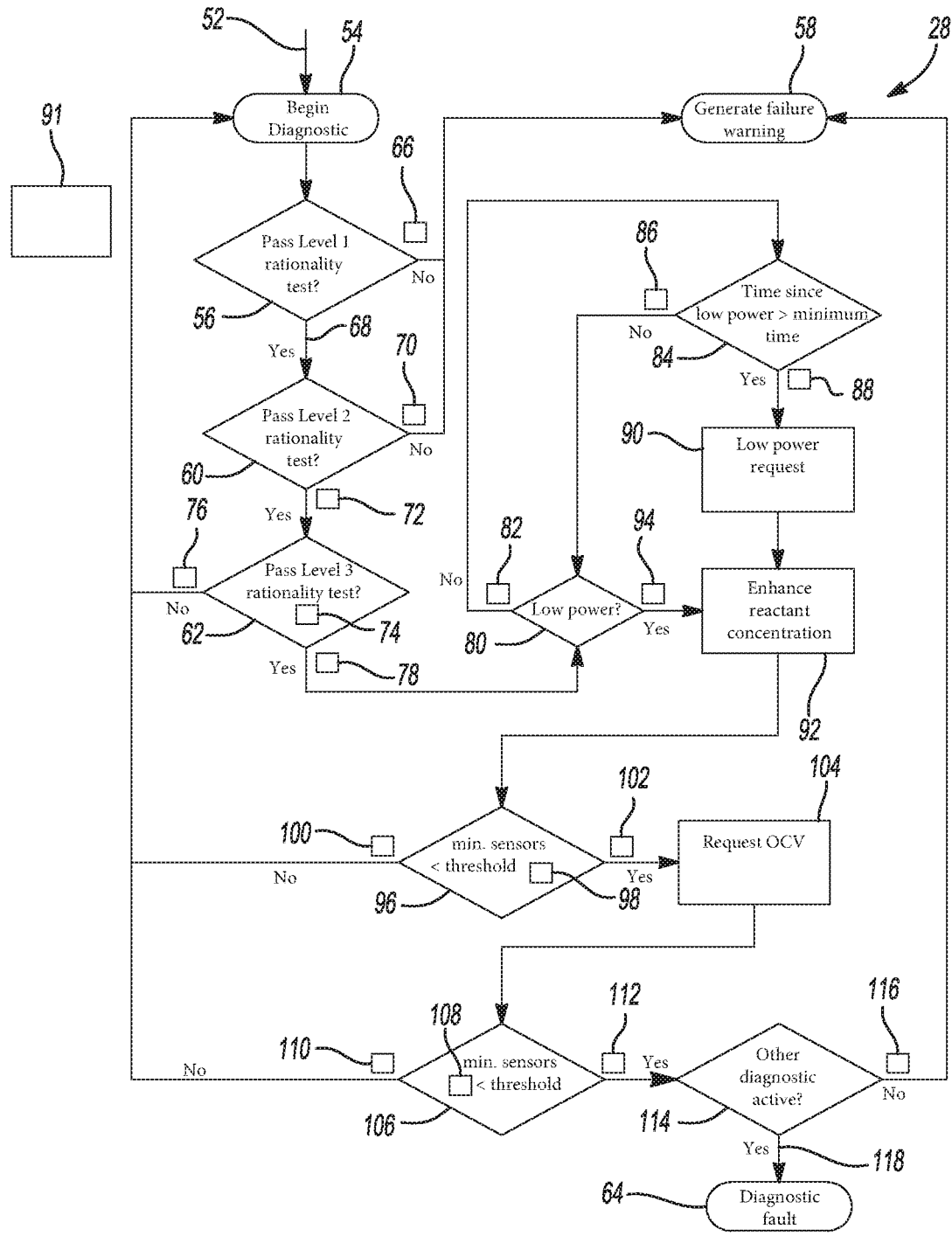
FIG. 3 is a diagrammatic presentation of a portion of the system of FIG. 2.

If the results of both the Level I rationality test 56 and the Level II rationality test 60 indicate voltage sensor values are within the range or the average output signal of the voltage sensor, a Level III rationality test 62 is conducted, which is explained in greater detail in reference to FIG. 3. The Level III rationality test 62 can be used as an indication of a sensor failure. If at the end of the analyses conducted using the algorithm 28 a sensor failure is indicated, a diagnostic fault 64 is indicated.

Figure 2:
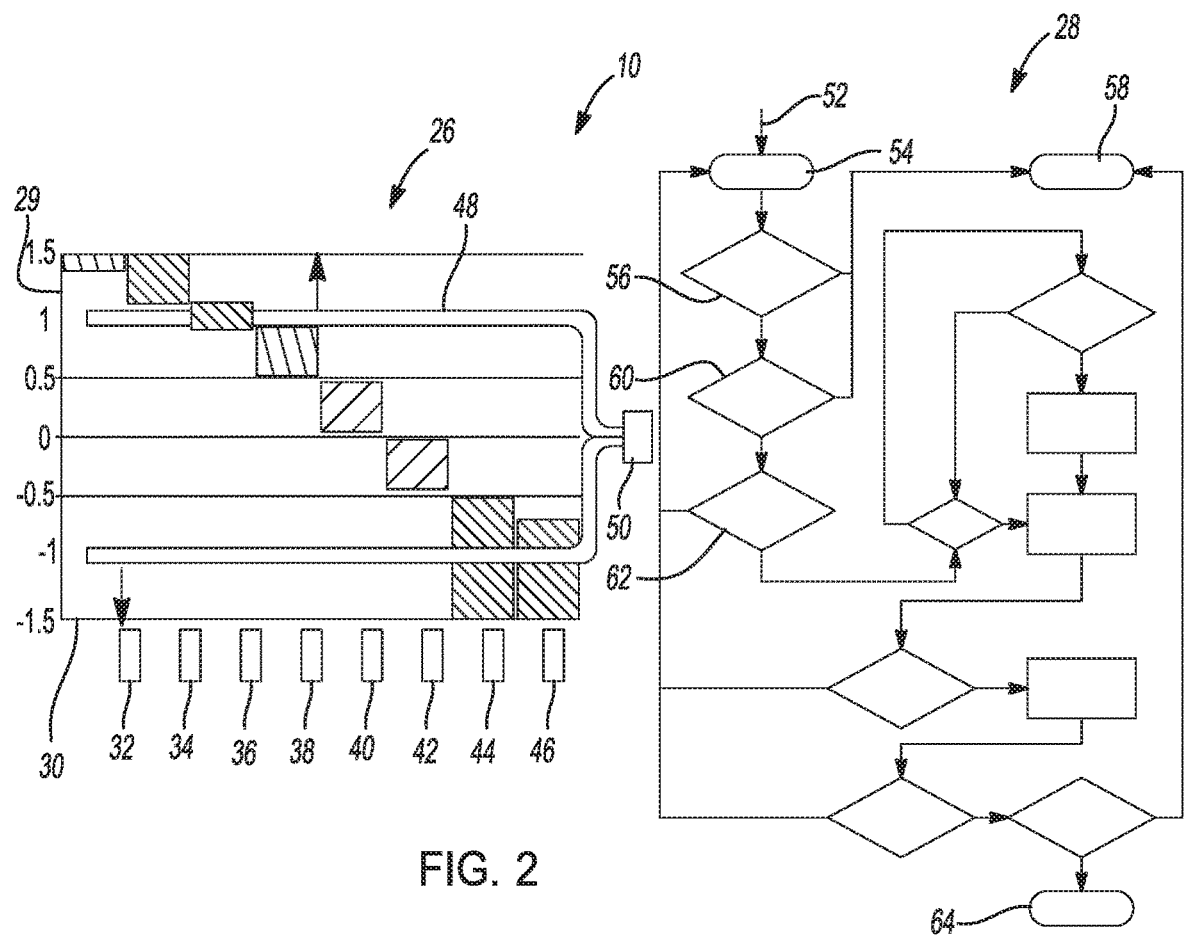
FIG. 2 is a diagrammatic presentation of a fuel cell stack voltage sensor diagnostic system according to an exemplary embodiment.

Referring to FIG. 3 and again to FIGS. 1 and 2, operational steps used by the algorithm 28 are as follows. If the level I rationality test 56 fails, a fail signal 66 is forwarded to generate the cell measurement failure warning 58. If the level I rationality test 56 passes, a pass signal 68 is forwarded to initiate the level II rationality test 60. If the level II rationality test 60 fails, a fail signal 70 is forwarded to generate the cell measurement failure warning 58. If the level II rationality test 60 passes, a pass signal 72 is forwarded to initiate the level III rationality test 62.

During the level III rationality test 62 it is determined if a minimum value of the sensor signal is less than a first predetermined threshold 74. The first predetermined threshold 74 is based on system defined criteria, such as averaging the characteristics of multiple measured fuel cell stacks, and can be adaptive based on continuing stack and cell health monitoring. The first predetermined threshold 74 is selected to minimize false positives. If the minimum value of the sensor signal is NOT less than the first predetermined threshold 74, a restart signal 76 is generated to return the algorithm 28 to the second step 54 to restart the diagnostic analyses. If the minimum value of the sensor signal IS less than the first predetermined threshold 74, a start signal 78 initiates a power request 80 which determines if the fuel cell stack 12 is operating in a low power mode, such as for example at or below approximately 5 kW.

If a negative response 82 is generated to the power request 80 a time request step 84 is conducted. During the time request step 84, a time since operation at low power is compared against a predetermined minimum time. If the time since operation at low power is not greater than the predetermined minimum time, a loop return 86 is conducted to restart the power request 80. The loop return 86 is performed because in a subsequent portion of the algorithm 28, it is advantageous to conduct further signal testing only at fuel cell stack low power, and repeating the time request step 84 permits the fuel cell stack 12 to normalize at low power operation.

If a positive response 88 is generated to the power request 80 and the time since operation at low power is greater than the predetermined minimum time, a low power request 90 is sent to a vehicle system controller 91 identifying that when permitted and feasible, for example when the vehicle operator is not requesting high power or high speed operation, an enhanced reactant concentration test 92 at the electrodes of the fuel cell stack 12 is requested. When permitted by the vehicle system controller 91 the enhanced reactant concentration test 92 will confirm if a low cell condition is present, which must be evaluated at low power operation. The enhanced reactant concentration test 92 will temporarily minimize mass transport or parasitic current related effects by removing excess water that may have built up in the fuel cells 14 or by increasing a reactant concentration (increase the hydrogen and oxygen supply) to temporarily ensure a known reactant concentration is present. Water may be driven out of the fuel cells for example by increasing cell pressure, increasing cell flow rate, and/or increasing cell temperature for a predetermined period of time.

These conditions cannot be set when the fuel cell stack 12 may be required to deliver power above the low power level, and are preferably established when the fuel cell stack power demand is substantially zero. The vehicle system controller 91 will therefore receive the low power request 90 and either grant the request based on system performance demand, or place the request on hold pending the system reaching the necessary power level. It is also noted that if the response from the power request 80 is that the fuel cell stack 12 is operating in the low power mode, the time request step 84 is bypassed and the enhanced reactant concentration test 92 can be immediately performed.

It is desirable to be at low power in order for the fuel cell stack 12 to be operating in a kinetic region of the power curve, where the real or measured performance of the fuel cell stack 12 most closely resembles ideal conditions. Low power conditions also allow testing to be performed which does not impact driver intended changes or demand. The physics of the electrochemical potential at low power are not confounded by kinetic, resistive, ionic, or fuel reaction losses. At low power, performance of the enhanced reactant concentration test 92 are not sensed by the operator.

After an enhanced reactant concentration test 92 is performed, the output signals from the fuel cell stack voltage sensors such as the overall stack voltage sensor 16, the dedicated first end cell sensor 20 and the dedicated second end cell sensor 24 are again analyzed to determine if fuel cell stack conditions such as flooding have been cleared or are not impacting sensor readings. Pressure sensor readings are also used to confirm if cell passages are clear of flooding. In a first comparison test 96, minimum output sensor values are compared against a second predetermined threshold 98. The second predetermined threshold 98 is at least equal to or greater than the first predetermined threshold 74 because the fuel cell stack 12 is expected to have been cleared of cell flooding and a higher fuel concentration has been fed to the fuel cells, therefore higher cell voltages are expected to be measured. Pressure and voltage baselines are determined, for example from predetermined data in a data table based on the present power range which are used to predict an expected output voltage to compare against the new voltage output received from the voltage sensors.

If a minimum voltage is greater than the second predetermined threshold 98 a negative response 100 is generated which returns the system to the second step 54 where the diagnostic analyses is restarted. The negative response 100 indicates the fuel cells are no longer experiencing low potential due to a fault condition such as flooding or improper fuel concentration, therefore a correctable cell problem has been corrected, the sensor is not faulted and the diagnostic can be restarted.

With the fuel cell stack 12 still operating at low power, if a minimum voltage is less than the second predetermined threshold 98 a positive response 102 is generated, from which an open circuit voltage request 104 is generated and forwarded to the vehicle system controller 91. The vehicle system controller 91 receives the open circuit voltage request 104 and will either grant the request if vehicle operating conditions permit, or place the request on hold. The open circuit voltage request 104 orders the system boost converter to pull zero power from the fuel cell stack 12 while reactants are still being fed into the fuel cell stack 12. A maximum fuel cell stack potential should therefor occur, approaching the theoretical cell voltage limit of the fuel cell stack 12.

After the open circuit voltage request 104 is granted, sensor voltages are re-measured and re-analyzed. In a second comparison test 106, minimum output sensor values are compared against a third predetermined threshold 108. The third predetermined threshold 108 is at least equal to or greater than the second predetermined threshold 98 because the fuel cell stack 12 is expected to be producing its maximum cell voltage. If the minimum sensor voltage is greater than the third predetermined threshold 108 a negative response 110 is generated which returns the system to the second step 54 where the diagnostic analyses is restarted. The negative response 110 indicates the fuel cells are performing as expected, therefore a sensor is not faulted and the diagnostic can be restarted.

With the fuel cell stack 12 still operating per the open circuit voltage request 104 if a minimum voltage is less than the third predetermined threshold 108 a positive response 112 is generated and an other-active diagnostic request 114 is conducted to determine if some other diagnostic test indicates a different fuel cell stack problem, such as a stack or cell short. If the response to the other-active diagnostic request 114 is negative 116, the cell measurement failure warning 58 is generated, for which a predetermined remediate action can be taken. If the response to the other-active diagnostic request 114 is positive 118, the diagnostic fault 64 is indicated.

Figure 4:
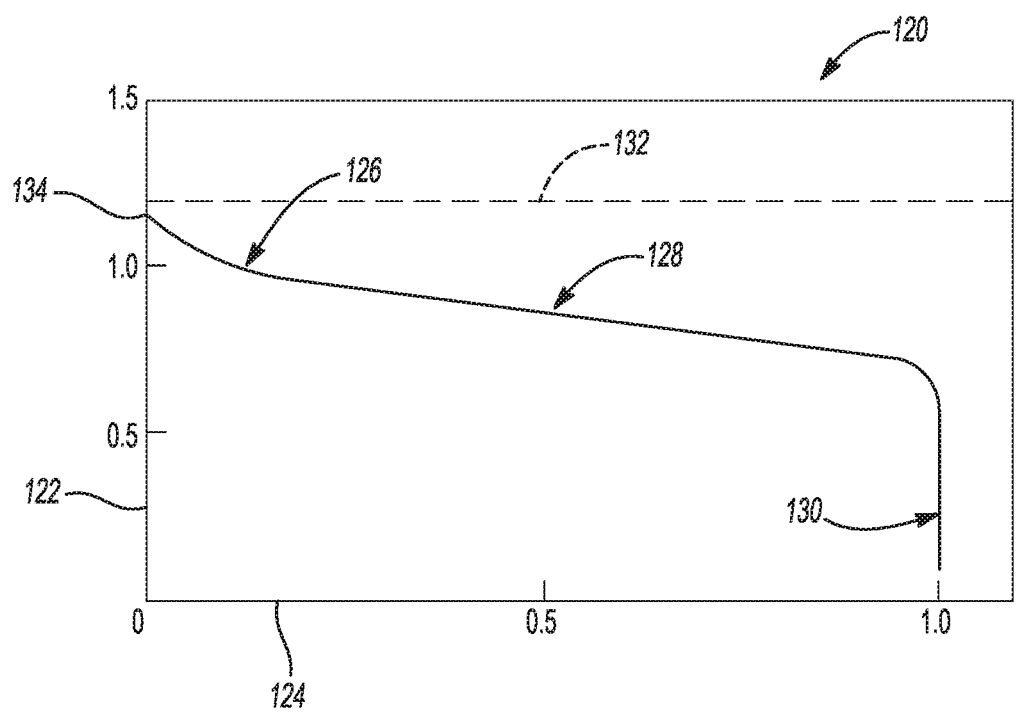
FIG. 4 is a graph of voltage potential versus current for the fuel cell stack voltage sensor diagnostic system of the present disclosure.

Referring to FIG. 4 and again to FIG. 3, a graph 120 presents different ranges of cell potential voltages 122 over a range of cell current 124 for the hydrogen fuel cell stack 12. Cell potential losses due to activation over-potential create a cell potential voltage range 126 at very low cell current. A dropping cell potential voltage 128 due to ohmic losses occurs over a middle cell current range. Mass transport losses cause a cell potential voltage 130 to reach substantially zero at maximum cell current of 1.0 amp. As previously noted, to eliminate the effects of mass transport, ohmic and kinetic losses when determining if the voltage sensors are operating properly, the open circuit voltage request 104 can be made. A maximum potential voltage 132 of the fuel cell stack 12 is approached at a high cell potential voltage 134 when the open circuit voltage request 104 orders the system boost converter to pull zero power from the fuel cell stack 12 while reactants are still being fed into the fuel cell stack 12. The cell potential voltage 134 can then be used as a baseline voltage against which actual voltage sensor output can be compared.

A fuel cell stack voltage sensor diagnostic system 10 of the present disclosure offers several advantages. The fuel cell stack voltage sensor diagnostic system 10 provides a multi-step approach to successively eliminate various fuel cell issues that may be causing voltage sensor output discrepancies. Multiple step re-testing of voltage sensor output using different predetermined thresholds provides an increasing level of assurance that a sensor fault is not occurring before a system sensor failure is determined. The fuel cell stack voltage sensor diagnostic system 10 applying the algorithm 28 thereby provides increased confidence that a reduced quantity of system voltage sensors will accurately provide fuel cell stack voltage potential.

The description of the present disclosure is merely exemplary in nature and variations that do not depart from the gist of the present disclosure are intended to be within the scope of the present disclosure. Such variations are not to be regarded as a departure from the spirit and scope of the present disclosure.

What is claimed is:

1. A method for evaluating voltage sensor output using a fuel cell stack voltage sensor diagnostic system, comprising:
   determining in a first level rationality test if a maximum value of a fuel cell voltage sensor signal of a fuel cell stack is less than a sensor limit, and if a minimum value of the sensor signal is greater than the sensor limit;
   performing a second level rationality test to identify if the maximum value of the sensor signal is greater than an average sensor signal value and if the average sensor signal value is greater than the minimum value of the sensor signal;
conducting a third level rationality test to identify if the minimum value of the sensor signal is less than a first predetermined threshold; and
initiating a power request to a vehicle system controller to identify if the fuel cell stack is operating in a low power mode if the minimum value of the sensor signal is less than the first predetermined threshold.

2. The method for evaluating voltage sensor output using a fuel cell stack voltage sensor diagnostic system of claim 1, further including generating a cell measurement failure warning if either the maximum value of the sensor signal is greater than the sensor limit or if the minimum value of the sensor signal is less than the sensor limit.

3. The method for evaluating voltage sensor output using a fuel cell stack voltage sensor diagnostic system of claim 2, further including generating the cell measurement failure warning if either the maximum value of the sensor signal is greater than the average sensor signal value or if the average sensor signal value is less than the minimum value of the sensor signal.

4. The method for evaluating voltage sensor output using a fuel cell stack voltage sensor diagnostic system of claim 1, further including conducting a time request if a negative response is generated to the power request wherein a determination of a time since operation at low power is compared against a predetermined time.

5. The method for evaluating voltage sensor output using a fuel cell stack voltage sensor diagnostic system of claim 1, further including:
sending a request to perform an enhanced reactant concentration test to the vehicle system controller; and
performing the enhanced reactant concentration test when permitted by the vehicle system controller including increasing at least one of a system pressure, a system temperature, and a system flow to remove liquid water in the fuel cell stack.

6. The method for evaluating voltage sensor output using a fuel cell stack voltage sensor diagnostic system of claim 5, further including in a first comparison test conducting a reanalysis of the fuel cell voltage sensor signal to identify if the minimum value of the sensor signal is less than a second predetermined threshold at least equal to or higher than the first predetermined threshold.

7. The method for evaluating voltage sensor output using a fuel cell stack voltage sensor diagnostic system of claim 6, further including submitting an open circuit voltage request to the vehicle system controller.

8. The method for evaluating voltage sensor output using a fuel cell stack voltage sensor diagnostic system of claim 7, further including:
after the open circuit voltage request is granted, conducting a reanalysis of the fuel cell voltage sensor signal and in a second comparison test the minimum value of the sensor signal is compared against a third predetermined threshold at least equal to or higher than the second predetermined threshold; and
evaluating if any other diagnostic faults are active.

9. A method for evaluating voltage sensor output using a fuel cell stack voltage sensor diagnostic system, comprising:
measuring an overall fuel cell stack voltage using a fuel cell stack voltage sensor;
identifying a fuel cell voltage of each of a first end cell of the fuel cell stack using a first end cell voltage sensor and a second end cell of the fuel cell stack using a second end cell voltage sensor;
determining in a first level rationality test if a maximum value of the overall fuel cell stack voltage, the fuel cell voltage of the first end cell or the fuel cell voltage of the second end cell is less than a sensor limit, and if a minimum value of the of the overall fuel cell stack voltage, the fuel cell voltage of the first end cell or the fuel cell voltage of the second end cell is greater than the sensor limit;
performing a second level rationality test to identify if the maximum value is greater than an average sensor signal value and if the average sensor signal value is greater than the minimum value;
conducting a third level rationality test to identify if the minimum value is less than a first predetermined threshold;
initiating a power request to a vehicle system controller to identify if the fuel cell stack is operating in a low power mode if the minimum value is less than the first predetermined threshold; and
sending a request to perform an enhanced reactant concentration test to the vehicle system controller after confirming a time since operation at low power is greater than the predetermined minimum time.

10. The method for evaluating voltage sensor output using a fuel cell stack voltage sensor diagnostic system of claim 9, wherein the measuring and the identifying steps further include determining fuel cell voltage values ranging between −1.5 potential volts DC to +1.5 potential volts DC for multiple characteristics of the fuel cell stack including ranges of a cathode-oxygen evolution reaction value, a cathode carbon corrosion value, a cathode ECSA loss value, a normal operating value, a cathode starvation value, an anode-platinum-oxide value, anode-carbon corrosion value, and an anode-oxygen-evolution reaction value.

11. The method for evaluating voltage sensor output using a fuel cell stack voltage sensor diagnostic system of claim 9, further including:
conducting a reanalysis of the overall fuel cell stack voltage, the fuel cell voltage of the first end cell or the fuel cell voltage of the second end cell;
submitting an open circuit voltage request to the vehicle system controller if the minimum value is less than a second predetermined threshold at least equal to or higher than the first predetermined threshold;
requesting an open circuit voltage state; and
conducting a reanalysis of the overall fuel cell stack voltage, the fuel cell voltage of the first end cell or the fuel cell voltage of the second end cell and in a second comparison test comparing the minimum value against a third predetermined threshold at least equal to or higher than the second predetermined threshold.

12. A method for evaluating voltage sensor output using a fuel cell stack voltage sensor diagnostic system, comprising:
measuring an overall fuel cell stack voltage using a fuel cell stack voltage sensor;
determining in a first level rationality test if a maximum value of the overall fuel cell stack voltage is less than a sensor limit, and if a minimum value of the overall fuel cell stack voltage is greater than the sensor limit;
performing a second level rationality test to identify if the maximum value is greater than an average sensor signal value and if the average sensor signal value is greater than the minimum value;

conducting a third level rationality test to identify if the minimum value is less than a first predetermined threshold;

initiating a power request to a vehicle system controller to identify if the fuel cell stack is operating in a low power mode if the minimum value is less than the first predetermined threshold; and sending a low power request to the vehicle system controller if a time since operation at low power is greater than a predetermined minimum time.

13. The method for evaluating voltage sensor output using a fuel cell stack voltage sensor diagnostic system of claim 12, further including sending a request to perform an enhanced reactant concentration test to the vehicle system controller after confirming the fuel cell stack has been operating at low power for greater than the predetermined minimum time.

14. The method for evaluating voltage sensor output using a fuel cell stack voltage sensor diagnostic system of claim 13, further including:

performing the enhanced reactant concentration test when permitted by the vehicle system controller including increasing at least one of a system pressure, a system temperature and a system flow to remove liquid water in the fuel cell stack; and repeating the measuring the overall fuel cell stack voltage using the fuel cell stack voltage sensor, repeating the determining in the first level rationality test if the maximum value of the overall fuel cell stack voltage is less than the sensor limit, and if the minimum value of the overall fuel cell stack voltage is greater than the sensor limit, repeating the performing the second level rationality test to identify if the maximum value is greater than the average sensor signal value and if the average sensor signal value is greater than the minimum value, and repeating the conducting the third level rationality test to identify if the minimum value is less than the first predetermined threshold.

15. The method for evaluating voltage sensor output using a fuel cell stack voltage sensor diagnostic system of claim 14, further including:

identifying a fuel cell voltage of each of a first end cell of the fuel cell stack using a first end cell voltage sensor and a second end cell of the fuel cell stack using a second end cell voltage sensor;

during the first level rationality test further determining if a maximum value of the fuel cell voltage of the first end cell or the fuel cell voltage of the second end cell is less than the sensor limit, and if a minimum value of the fuel cell voltage of the first end cell or the fuel cell voltage of the second end cell is greater than the sensor limit; and in a first comparison test conducting a reanalysis of the overall fuel cell stack voltage, the fuel cell voltage of the first end cell or the fuel cell voltage of the second end cell.

16. The method for evaluating voltage sensor output using a fuel cell stack voltage sensor diagnostic system of claim 15, further including:

submitting an open circuit voltage request to the vehicle system controller if the minimum value is less than a second predetermined threshold at least equal to or higher than the first predetermined threshold; and after the open circuit voltage request is granted, conducting a reanalysis of the of the overall fuel cell stack voltage, the fuel cell voltage of the first end cell or the fuel cell voltage of the second end cell and in a second comparison test the minimum value is compared against a third predetermined threshold at least equal to or higher than the second predetermined threshold.

17. The method for evaluating voltage sensor output using a fuel cell stack voltage sensor diagnostic system of claim 16, further including conducting a fuel cell stack short analysis if the minimum value is less than the third predetermined threshold.

* * * * *